United States Patent
Simonnet

(10) Patent No.: US 6,818,927 B2
(45) Date of Patent: Nov. 16, 2004

(54) SENSITIVE HIGH BIDIRECTIONAL STATIC SWITCH

(75) Inventor: Jean-Michel Simonnet, Veretz (FR)

(73) Assignee: STMicroelectronics S.A., Montrouge (FR)

(*) Notice: Subject to any disclaimer, the term of this patent is extended or adjusted under 35 U.S.C. 154(b) by 22 days.

(21) Appl. No.: 10/182,540

(22) PCT Filed: Dec. 20, 2001

(86) PCT No.: PCT/FR01/04138
§ 371 (c)(1),
(2), (4) Date: Jul. 25, 2002

(87) PCT Pub. No.: WO02/50916
PCT Pub. Date: Jun. 27, 2002

(65) Prior Publication Data
US 2004/0021148 A1 Feb. 5, 2004

(30) Foreign Application Priority Data
Dec. 21, 2000 (FR) .............................. 00/16835

(51) Int. Cl.$^7$ .............................................. H01L 29/74
(52) U.S. Cl. ...................... 257/107; 257/115; 257/123; 257/601
(58) Field of Search ................................. 257/107, 119, 257/173, 601, 115, 123; 438/138, 268

(56) References Cited

U.S. PATENT DOCUMENTS

| | | | |
|---|---|---|---|
| 4,066,483 A | | 1/1978 | D'Altroy et al. |
| 4,157,562 A | | 6/1979 | D'Altroy et al. |
| 4,994,884 A | * | 2/1991 | Kato et al. .................... 257/123 |
| 6,017,778 A | * | 1/2000 | Pezzani ....................... 438/138 |
| 6,034,381 A | | 3/2000 | Pezzani |
| 6,583,496 B2 | * | 6/2003 | Galtie et al. ................. 257/601 |
| 6,593,600 B1 | * | 7/2003 | Duclos et al. ............... 257/107 |

FOREIGN PATENT DOCUMENTS

| | | | | |
|---|---|---|---|---|
| EP | 1 076 365 A1 | | 2/2001 | |
| EP | 1 076 365 | * | 2/2001 | ......... H01L/29/747 |

OTHER PUBLICATIONS

English translation of the International Preliminary Examination Report from priority application no. PCT/FR01/04138.

* cited by examiner

Primary Examiner—David Nelms
Assistant Examiner—Dao H. Nguyen
(74) Attorney, Agent, or Firm—Lisa K. Jorgenson; William R. McClellan; Wolf, Greenfield & Sacks, P.C.

(57) ABSTRACT

A monolithic bidirectional switch formed in a semiconductor substrate of type N, including a first main vertical thyristor, the rear surface layer of which is of type P, a second main vertical thyristor, the rear surface layer of which is of type N, an auxiliary vertical thyristor, the rear surface layer of which is of type P and is common with that of the first main thyristor, a peripheral region of type P especially connecting the rear surface layer of the auxiliary thyristor to the layer of this thyristor located on the other side of the substrate, a first metallization on the rear surface side, a second metallization on the front surface side connecting the front surface layers of the first and second thyristors. An additional region has a function of isolating the rear surface of the auxiliary thyristor and the first metallization.

19 Claims, 2 Drawing Sheets

SENSITIVE HIGH BIDIRECTIONAL STATIC SWITCH

BACKGROUND OF THE INVENTION

1. Field of the Invention

The present invention relates to the manufacturing in monolithic form of medium power bidirectional switches.

2. Discussion of the Related Art

The most current static bidirectional switches are triacs. A triac corresponds to the antiparallel connection of two thyristors. It can thus be directly connected in an A.C. network, for example, the mains. The gate of a conventional triac corresponds to the cathode gate of one at least of the two thyristors forming it and is referenced to the electrode located on the front surface side of this triac, that is, the surface including the gate terminal. As a result, the other surface or rear surface of the triac, which is currently connected to a radiator is at the high voltage, which poses isolation problems.

Bidirectional switches of the type described in U.S. Pat. No. 6,034,381 (B3073), the triggering of which is ensured by application of a voltage between a control electrode located on the front surface of the component and a main electrode located on the opposite surface of the component will more specifically be considered hereafter. U.S. Pat. No. 6,034,381 is hereby incorporated by reference.

FIG. 1 shows an equivalent electric diagram of such a bidirectional switch. A control electrode G of the bidirectional switch is connected to the emitter of a bipolar transistor T having its collector connected to the anode gates of first and second thyristors Th1 and Th2 arranged in antiparallel between two terminals A1 and A2. Terminal A1 corresponds to the anode of thyristor Th1 and to the cathode of thyristor Th2. Terminal A1 is also connected to the base of transistor T. Terminal A2 corresponds to the anode of thyristor Th2 and to the cathode of thyristor Th1.

FIG. 2 is a simplified cross-section view of an example of monolithic forming of the bidirectional switch described in relation with FIG. 1. Transistor T is formed in the left-hand portion of the drawing, thyristor Th1 is formed at the center, and thyristor Th2 is formed to the right.

The structure of FIG. 2 is formed from a lightly-doped N-type semiconductor substrate 1. The anode of thyristor Th1 corresponds to a P-type layer 2, which is formed on the rear surface side of substrate 1. Its cathode corresponds to an N-type region 3 formed on the front surface side in a P-type well 4. The anode of thyristor Th2 corresponds to a P-type well 5 formed on the front surface side and its cathode corresponds to an N-type region 6 formed on the rear surface side in layer 2. The structure periphery is formed of a heavily-doped P-type region 7 extending from the front surface to P-type layer 2. Conventionally, region 7 is obtained by drive-in from the two substrate surfaces. The rear surface is coated with a metallization M1 corresponding to first terminal A1 of the bidirectional switch. The upper surfaces of regions 3 and 5 are coated with a second metallization M2 corresponding to the second terminal A2 of the bidirectional switch. An N-type region 8 is formed, on the front surface side, in a P-type well 9 in contact with peripheral region 7. The surface of region 8 forms one piece with a metallization M3 connected to control terminal G of the bidirectional switch. A metallization M4 may be formed on the upper surface of peripheral region 7. Metallization M4 is not connected to an external terminal. As an alternative, well 9 may be separated from peripheral region 7 and electrically connected thereto via metallization M4.

The operation of the bidirectional switch is the following.

When terminal A2 is negative with respect to terminal A1, thyristor Th1 is likely to be on. If a sufficiently negative voltage with respect to metallization M1 is applied on gate G, the base-emitter junction of transistor T is forward biased and this transistor turns on. A vertical current $i_c$ shown in dotted lines in FIG. 2 thus flows from metallization M1, through the forward junction between layer 2 and substrate 1, then into regions 1, 9, and 8 corresponding to transistor T. There thus is a generation of carriers at the level of the junction between substrate 1 and well 9 close to the junction between substrate 1 and well 4, and thyristor Th1 is turned on. It can also be considered that the triggering of an auxiliary vertical NPNP thyristor including regions 8-9-1-2, region 9 of which forms the cathode gate region, has been caused.

Similarly, in the case where terminal A2 is positive with respect to terminal A1, the applying of a negative voltage on terminal G turns transistor T on. The carriers present in the vicinity of the junction between substrate 1 and layer 2 turn thyristor Th2 on, as will be better understood by referring to the simplified top view of FIG. 4 in which it can be seen that the region corresponding to transistor T is close to a portion of each of thyristors Th1 and Th2.

Practice reveals that this type of bidirectional switch has a non-optimal control sensitivity, that is, especially, the current required to trigger thyristor Th1 is of several hundreds of milliamperes.

The applicant has provided in unpublished French patent application 99/10412 (B4341) of Aug. 9, 1999, which is incorporated herein by reference, another embodiment in monolithic form of a bidirectional switch of the above-mentioned type, in which thryistor Th1 has a greater control sensitivity.

FIG. 3 is a simplified cross-section view of an embodiment of such a monolithic bidirectional switch. The structure of the various areas formed in semiconductor substrate 1 is identical to that illustrated in FIG. 2. The difference between the two drawings is that a region 10 having an isolation function, substantially under the above-mentioned auxiliary vertical thyristor, is provided on the rear surface side, between layer 2 and metallization M1. This also appears from FIG. 4 in which the contour of region 10 is designated by a dotted line in the bottom left-hand portion of the drawing. Layer 6, not shown in FIG. 4, occupies the entire lower surface except for the area located under P-type well 4 and the surface occupied by region 10.

Region 10 is formed of a semiconductor N-type doped material, preferably silicon oxide ($SiO_2$).

The operation of the bidirectional switch remains substantially similar to what has been described in relation with FIG. 2. However, base current $i_b$ of transistor T, running from metallization M1 to region 8, is now deviated by the presence of region 10, according to path $i_b$ of FIG. 3.

The main current of the auxiliary vertical thyristor is also deviated, as shown by arrows $i_c$. It can be seen that by modifying the dimensions of region 10, the passing of current $i_c$ is favored in the vicinity of the areas where it is most efficient to turn thyristor Th1 on, that is, close to the limit of well 4.

Tests performed by the applicant have shown that the triggering current of thyristor Th1 is minimized when region 10 extends to face P-type well 4 in which N-type region 3 forming the cathode of thyristor Th1 is formed.

The thickness of region 10 must be sufficiently small to initially enable the starting of transistor T by the conduction of current $i_b$ from layer 2 to region 8 via peripheral region 7. Indeed, if region 10 is too thick, the remaining thickness of layer 2 between region 10 and substrate 1 causes the existence of too high a resistance that opposes to the flowing of base current $i_b$.

In practice, the thickness of region 10 will be smaller than that of layer 6. Indeed, layer 6 forms the cathode of thyristor Th2 and its thickness is determined by the characteristics, especially relating to the turn-on current, of this sole thyristor. The thickness of layer 6 will for example be on the order of 10 to 15 μm, while the thickness of region 10 will be as small as possible.

SUMMARY OF THE INVENTION

An object of the present invention is to improve structures of the previously described type and especially to reduce their surface area for an equal power.

To achieve this and other objects, the present invention provides a monolithic bidirectional switch formed in a semiconductor substrate of a first conductivity type having a front surface and a rear surface, including a first main vertical thyristor, the rear surface layer of which is of the second conductivity type, a second main vertical thyristor, the rear surface layer of which is of the first conductivity type, a peripheral region of the second conductivity type extending from the front surface to the rear surface, a first metallization covering the rear surface, a second metallization on the front surface side connecting the front surface layers of the first and second thyristors, and a gate region of the first conductivity type in a portion of the upper surface of said peripheral region.

According to an embodiment of the present invention, the gate region is formed in a more heavily-doped portion of the upper surface of the peripheral region.

According to an embodiment of the present invention, the switch includes an additional region having a function of isolation on the rear surface side between the peripheral region and the first metallization, this additional region being interrupted under the areas corresponding to the first and second vertical thyristors.

According to an embodiment of the present invention, the additional region is made of a semiconductor material of the first conductivity type.

According to an embodiment of the present invention, the thickness of the additional region is smaller than that of the rear surface region of the second main vertical thyristor.

According to an embodiment of the present invention, the additional region is made of silicon oxide.

The foregoing and other objects, features and advantages of the present invention, will be discussed in detail in the following non-limiting description of specific embodiments in connection with the accompanying drawings, in which:

DETAILED DESCRIPTION

As usual in he representation of integrated circuits, FIGS. 2, 3, 4, and 5 are not drawn to scale.

Figure 5:
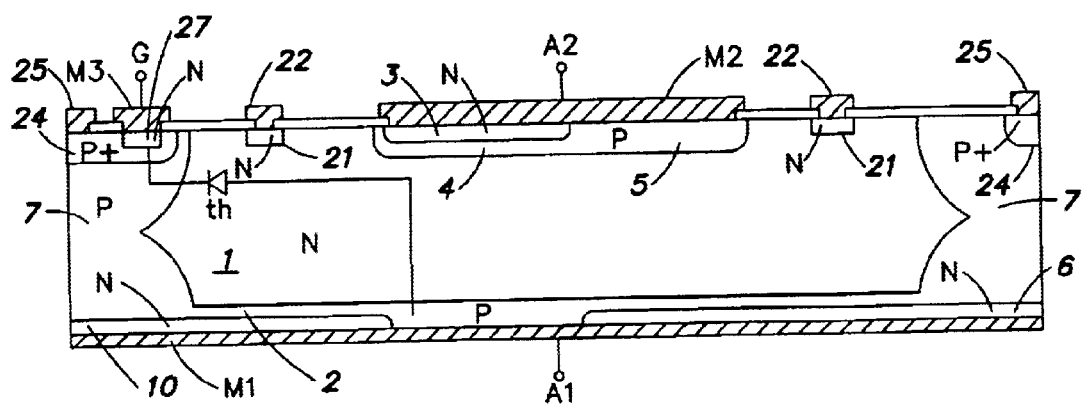
FIG. 5 is a simplified top view of a bidirectional switch according to the present invention.

FIG. 5 shows a structure according to the present invention. This structure is generally similar to that in FIG. 3, and same elements have been designated by same references. A few variants should be noted. On the one hand, P-type wells 4 and 5 on the upper side of the structure, corresponding to the anode of thyristor Th1 and to the cathode gate region of thyristor Th2, are confounded in a single well. On the other hand, the isolation and breakdown voltage structures have been better shown in FIG. 5. More specifically, lateral isolation walls 7 are conventionally formed by drive-in of a P-type dopant from the supper and lower substrate surfaces. Conventionally, these isolating walls have a surface doping level on the order of from $10^{16}$ to $10^{17}$ at./cm$^3$ and a doping level at their junction on the order of $10^{14}$ to $10^{15}$ at./cm$^3$, while N-type substrate 1 has a doping level on the order of $10^{13}$ to $10^{14}$ atoms/cm$^3$. Further, an N-type ring 21, which is conventionally used as a channel stop region and which is coated with a metallization 22, has been shown on the upper surface side. Metallization 22 is generally not connected to an external terminal and may extend to form a field plate. Finally, at the external periphery of isolating walls 7, a more heavily-doped P-type region 24 coated with a metallization 25, also intended for providing a better breakdown voltage, is conventionally formed.

According to an essential feature of the present invention, the triggering region associated with a gate G is a region 27 coated with a metallization M3. Region 27 is formed in the upper region of isolating wall 7, and preferably in a more heavily-doped region 24 at the upper part of this isolating wall.

Figure 1:
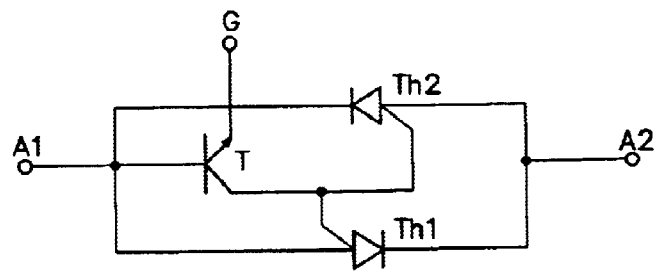
FIG. 1 is an electric diagram of a conventional bidirectional switch.
Figure 2:
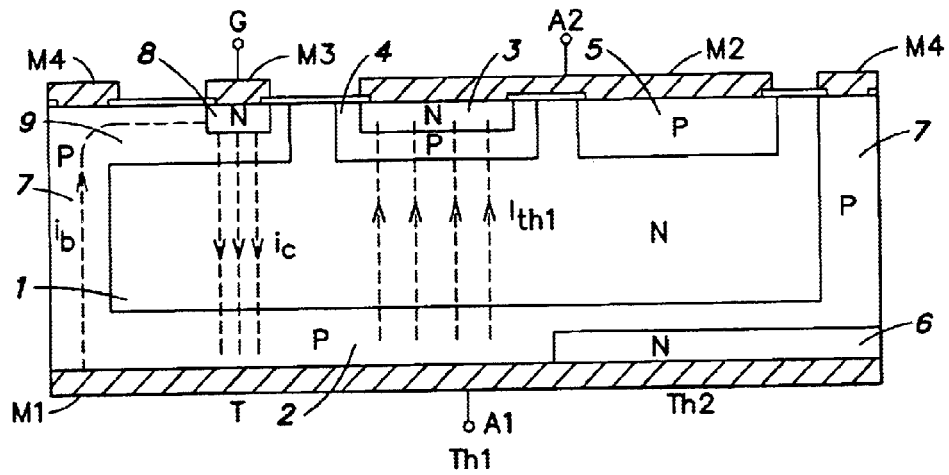
FIG. 2 is a simplified cross-section view of a conventional embodiment of the bidirectional switch of FIG. 1.
Figure 3:
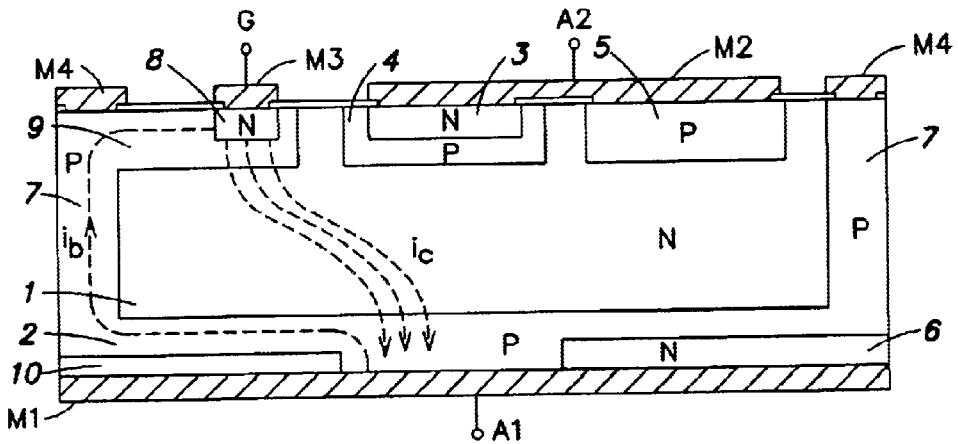
FIG. 3 shows an alternative of the bidirectional switch of FIG. 1.
Figure 4:
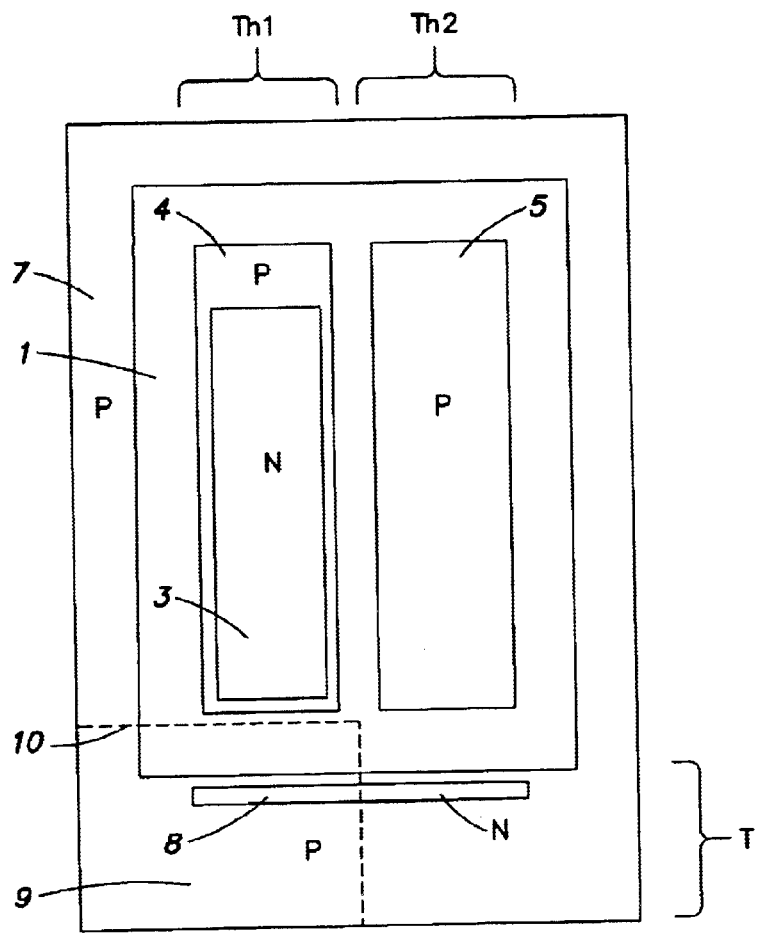
FIG. 4 shows an example of a top view of the bidirectional switch of FIG. 3.

This arrangement is different from the arrangement of prior art in which the turn-on region, designated by reference 8 in FIGS. 2 and 3, is arranged in an extension 9 of isolating wall 7. This arrangement is coherent with the explanation which used to be given of the component operation, and more specifically of the presence of an auxiliary thyristor helping the subsequent turning-on due to the generation of a current $i_c$.

The applicant has discovered that a gate area 27 arranged as schematically shown in FIG. 5 is sufficient to ensure the turning-on of the auxiliary thyristor designated by reference th in FIG. 5. It can then be believed that the carriers generated by the flowing of a gate current from metallization M3 to terminal A1 are sufficient to generate carriers in N-type substrate 1, these carriers enabling then ensuring the starting of one or the other of thyristors Th1 or Th2.

The measurements performed by the applicant have shown that the device according to the present invention has a turn-on sensitivity different from that of prior art structures, but that the sensitivity difference is in fact negligible.

For example, for a structure such as shown in FIG. 5, turn-on currents of respectively 2.1 and 2.9 milliamperes have been observed when the structure is submitted to a 12 volt voltage and, respectively, in quadrants Q2 (A2 positive with respect to A1) and Q3 (A2 negative with respect to A1). However, with the structure of prior art, the corresponding currents respectively were 1.7 and 5.1 mA. Thus, the structure according to the present invention has substantially the same turn-on sensitivity in the second quadrant and a greater turn-on sensitivity in the third quadrant.

A significant advantage of the present invention is a remarkable size decrease with respect to the structure of prior art. In practice, in real components, a space gain on the order of 6% per chip has been observed. Another advantage of the structure of the present invention is that the dimensions can be farther reduced due to the fact that the system breakdown voltage is better since the structure is perfectly symmetrical.

The present invention has been more specifically described in the case of a structure provided on the rear surface side of an isolation area 10. In fact, the present invention may apply to any bidirectional or undirectional component structure in which the triggering is ensured by the biasing of an area of a conductivity type opposite to a well extending to the rear surface side.

The present invention is likely to have various alterations, modifications, and improvements which will readily occur to those skilled in the art. In particular, all conductivity type could be inverted, the biasings being then correspondingly modified.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A monolithic bidirectional switch formed in a semiconductor substrate of a first conductivity type having a front surface and a rear surface, including:
    a first main vertical thyristor, a rear surface layer of which is of a second conductivity type,
    a second main vertical thyristor, a rear surface layer of which is of the first conductivity type,
    a peripheral region of the second conductivity type extending from the front surface of the substrate to the rear surface of the substrate,
    a first metallization covering the rear surface of the substrate,
    a second metallization on the front surface of the substrate connecting front surface layers of the first and second vertical thyristors, and
    a gate region of the first conductivity type in a portion of the a front surface of said peripheral region.

2. The bidirectional switch of claim 1, wherein the gate region is formed in a more heavily-doped portion of the front surface of the peripheral region.

3. The bidirectional switch of claim 1, including an additional region having a function of isolation on the rear surface between the peripheral region and the first metallization, this additional region being interrupted under areas corresponding to the first and second vertical thyristors.

4. The bidirectional switch of claim 3, wherein the additional region is made of a semiconductor material of the first conductivity type.

5. The bidirectional switch of claim 4, wherein the thickness of the additional region is smaller than that of the rear surface layer of the second main vertical thyristor.

6. The bidirectional switch of claim 3, wherein the additional region is made of silicon oxide.

7. A monolithic bidirectional switch in a semiconductor substrate of a first conductivity type having a front surface and a rear surface, comprising:
    a first vertical thyristor having a rear surface layer of a second conductivity type;
    a second vertical thyristor having a rear surface layer of the first conductivity type;
    a peripheral region of the second conductivity type extending from the front surface of the substrate to the rear surface of the substrate;
    a first metallization on the rear surface of the substrate;
    a second metallization on the front surface of the substrate; and
    a gate region of the first conductivity type on a front surface of the peripheral region.

8. A monolithic bidirectional switch as defined in claim 7, wherein the gate region is formed in a heavily-doped portion of the peripheral region.

9. A monolithic bidirectional switch as defined in claim 7, including an additional region between the peripheral region and the first metallization, the additional region being interrupted in areas corresponding to the first and second vertical thyristors.

10. A monolithic bidirectional switch as defined in claim 9, wherein the additional region is a semiconductor material of the first conductivity type.

11. A monolithic bidirectional switch as defined in claim 10, wherein the additional region has a thickness that is less than the thickness of the rear surface layer of the second vertical thyristor.

12. A monolithic bidirectional switch as defined in claim 9, wherein the additional region is silicon oxide.

13. A monolithic bidirectional switch as defined in claim 7, further comprising a third metallization covering the gate region.

14. A monolithic bidirectional switch as defined in claim 7, wherein the first vertical thyristor includes a front surface layer of the first conductivity type in a well of the second conductivity type and the second vertical thyristor includes a front surface layer of the second conductivity type.

15. A monolithic bidirectional switch as defined in claim 7, wherein the first vertical thyristor includes an anode of the first conductivity type in a well of the second conductivity type, wherein the well of the second conductivity type constitutes a cathode of the second vertical thyristor.

16. A method for fabricating a monolithic bidirectional switch in a semiconductor substrate of a first conductivity type having a front surface and a rear surface, comprising:
    forming a first vertical thyristor having a rear surface layer of a second conductivity type;
    forming a second vertical thyristor having a rear surface layer of the first conductivity type;
    forming a peripheral region of the second conductivity type extending from the front surface of the substrate to the rear surface of the substrate;
    forming a first metallization on the rear surface of the substrate;
    forming a second metallization on the front surface of the substrate; and
    forming a gate region of the first conductivity type on a front surface of the peripheral region.

17. A method as defined in claim 16, wherein forming the gate region comprises forming the gate region in a heavily-doped portion of the peripheral region.

18. A method as defined in claim 16, further comprising forming an additional region between the peripheral region and the first metallization, and interrupting the additional region in areas corresponding to the first and second vertical thyristors.

19. A monolithic bidirectional switch in a semiconductor substrate of a first conductivity type having a front surface and a rear surface, comprising:
- a first vertical thyristor having a rear surface layer of a second conductivity type;
- a second vertical thyristor having a rear surface layer of the first conductivity type;
- a peripheral region of the second conductivity type extending from the front surface of the substrate to the rear surface of the substrate; and
- a gate region of the first conductivity type on a front surface of the peripheral region.

* * * * *

UNITED STATES PATENT AND TRADEMARK OFFICE
CERTIFICATE OF CORRECTION

PATENT NO. : 6,818,927 B2  Page 1 of 1
APPLICATION NO. : 10/182540
DATED : November 16, 2004
INVENTOR(S) : Jean-Michel Simonnet It is certified that error appears in the above-identified patent and that said Letters Patent is hereby corrected as shown below:

On the title page item (54) and col. 1, lines 1 and 2 should read:
--HIGH-SENSITIVITY BIDIRECTIONAL STATIC SWITCH--

On the title page item (57), the Abstract should read:
--The invention concerns a bidirectional switch formed in a N-type semiconductor substrate, comprising a first main vertical thyristor whereof the rear face layer is of P-type conductivity, a second main vertical thyristor whereof the rear face layer is N-type, a P-type peripheral region extending from the front face to the rear face, a first metallization covering the rear face, a second metallization on the front face side connecting the front face layers of the first and second thyristor, and a N-type gate region in part of the upper surface of the peripheral region.--

In col. 2, line 36 should read
--mentioned type in which thyristor Th1 has a greater control--

In col. 5, line 6 should read
--sions can be further reduced due to the fact that the system--

In col. 2, line 36 should read
--invention may apply to any bidirectional or unidirectional--

Signed and Sealed this

Second Day of October, 2007

JON W. DUDAS
*Director of the United States Patent and Trademark Office*